United States Patent
Ho et al.

(10) Patent No.: US 6,913,814 B2
(45) Date of Patent: Jul. 5, 2005

(54) LAMINATION PROCESS AND STRUCTURE OF HIGH LAYOUT DENSITY SUBSTRATE

(75) Inventors: Kwun Yao Ho, Taipei (TW); Moriss Kung, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/717,116

(22) Filed: Nov. 19, 2003

(65) Prior Publication Data

US 2004/0105955 A1 Jun. 3, 2004

(30) Foreign Application Priority Data

Nov. 29, 2002 (TW) ........................................ 91134865 A

(51) Int. Cl.⁷ ............................ B32B 3/00; H01L 23/58
(52) U.S. Cl. ...................... 428/209; 428/901; 174/255; 257/635; 257/637; 257/642
(58) Field of Search ................................ 428/209, 901; 174/250, 255; 257/635, 637, 642

(56) References Cited

U.S. PATENT DOCUMENTS

| | | | | |
|---|---|---|---|---|
| 5,451,721 A | * | 9/1995 | Tsukada et al. ............. 174/261 |
| 5,744,758 A | * | 4/1998 | Takenouchi et al. ........ 174/255 |
| 6,207,259 B1 | * | 3/2001 | Iino et al. .................... 428/209 |
| 6,228,467 B1 | * | 5/2001 | Taniguchi et al. .......... 428/209 |
| 6,530,147 B1 | * | 3/2003 | Haas et al. .................... 29/829 |
| 6,764,748 B1 | * | 7/2004 | Farquhar et al. ............ 428/209 |

* cited by examiner

Primary Examiner—Cathy F Lam
(74) Attorney, Agent, or Firm—Squire, Sanders & Dempsey, L.L.P.

(57) ABSTRACT

A lamination process and structure of a high layout density substrate is disclosed. The lamination process comprises the following steps. First of all, a plurality of laminating layers are individually formed, wherein each laminating layer has a first dielectric layer, a plurality of first vias and a patterned conducting layer. Next, a bottom layer having a second dielectric layer and a plurality of second vias is formed. Then, the laminating layers and the bottom layer are stacked. Finally, the laminating layers and the bottom layer are laminated simultaneously to form a multiplayer substrate at one time.

17 Claims, 25 Drawing Sheets

LAMINATION PROCESS AND STRUCTURE OF HIGH LAYOUT DENSITY SUBSTRATE

PRIORITY REFERENCE TO PRIOR APPLICATION

This application claims benefit under 35 U.S.C. §119 of Taiwan patent application number 091134865, entitled "LAMINATION PROCESS AND STRUCTURE OF HIGH LAYOUT DENSITY SUBSTRATE," filed on Nov. 29, 2002, by inventors Kwun Yao HO and Moriss KUNG.

BACKGROUND OF THE INVENTION

1. Field of the Invention

The present invention relates to a lamination process and structure for a multi-layer substrate, and more particularly to a simultaneous lamination process and structure of a high layout density multi-layer substrate for a flip chip package or a main board.

2. Description of the Related Art

Conventional substrates used in flip chip package processes include build-up structures and laminate structures. FIG. 1 shows a flip chip package structure. A high density interconnect (HDI) structure 2 is formed on a base material 1 as shown in FIG. 1. The base material 1 and the high density interconnect structure 2 constitute the substrate of a flip chip package. The high density interconnect structure bonds to a "flipped" chip 7 through the connection between bumps 6 and bonding pads 5 to form a flip chip package structure. The high density interconnect structure 2 comprises a dielectric part 3 and a circuit 4. The high density interconnect structure 2 is multi-layered and can be formed by building up or laminating process. A flip chip substrate which has a high density interconnect structure directly formed level by level on a base material is a build-up substrate. The structure of the build-up substrate is formed by directly forming a high density interconnect structure (HDI) on a carrier substrate/core substrate as a printed circuit board (PCB). By directly forming a high density interconnect structure on a carrier substrate/core substrate, the HDI-on-PCB substrate has advantages of accurate build-up line/space and thickness control, accurate impedance control and embedding passive components. However, the HDI-on-PCB substrate has disadvantages of substrate dimension deviation in each build-up process, medium cost plus medium and unsatisfied yield. Moreover, since the HDI structure is formed by sequential build-up processes, the production cycle time is long and the cost of equipment investment is high.

In view of the drawbacks mentioned with the prior art structures and processes, there is a continued need to develop new and improved structures and processes that overcome the disadvantages associated with prior art structures and processes.

SUMMARY OF THE INVENTION

It is therefore an object of the invention to provide a simultaneous lamination process and structure of a high layout density substrate with low cost.

It is another object of this invention to provide a simultaneous lamination process and structure of a high layout density substrate with high throughput and short cycle time.

It is another object of this invention to provide a simultaneous lamination process and structure of a high layout density substrate with good electrical and thermal performance.

It is still another object of this invention to provide a simultaneous lamination process and structure of a high layout density substrate with high yield.

To achieve these objects, and in accordance with the purpose of the invention, the invention provides a simultaneous lamination process for forming a multi-layer substrate, the process comprises the following steps. First of all, a plurality of laminating layers are individually formed, wherein each laminating layer has a first dielectric layer, a plurality of first vias and a patterned conducting layer. Next, a bottom layer having a second dielectric layer and a plurality of second vias is formed. Then, the laminating layers and the bottom layer are stacked. Finally, the laminating layers and the bottom layer are laminated simultaneously to form a substrate.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow and structures. The present invention can be practiced in conjunction with various fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
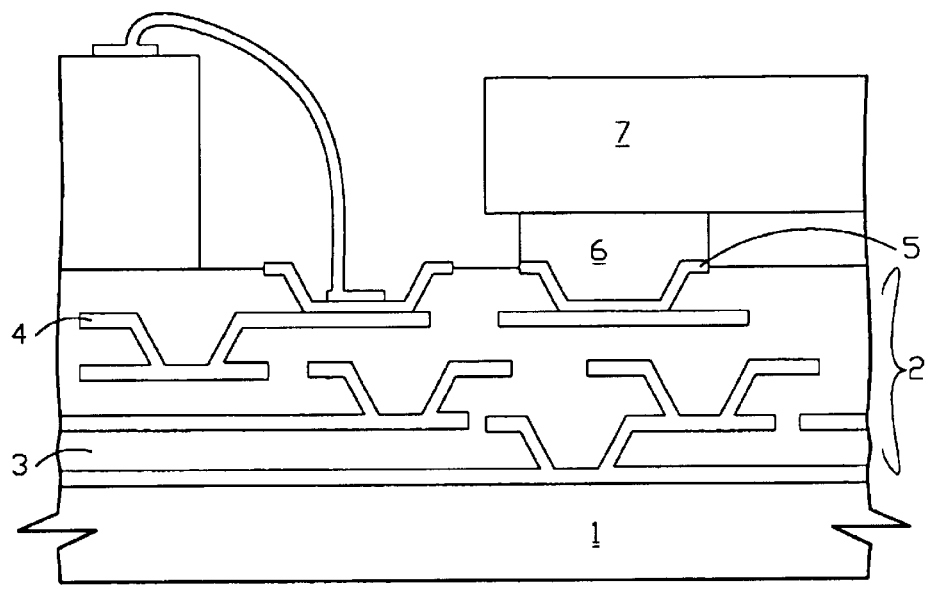
FIG. 1 shows a flip chip package structure.
Figure 2A:
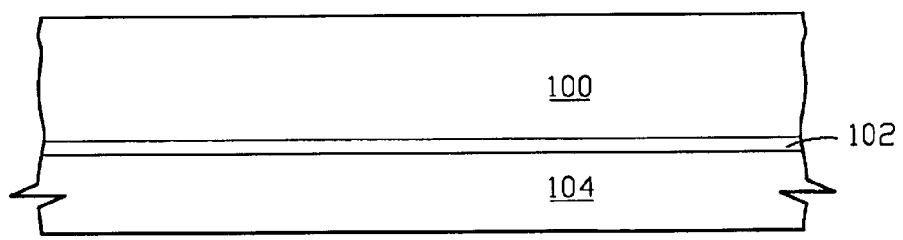
FIGS. 2A–2H show a process flow according to a first preferred embodiment of forming a laminating layer with vias, conductive patterns and dielectric layers.
Figure 2B:
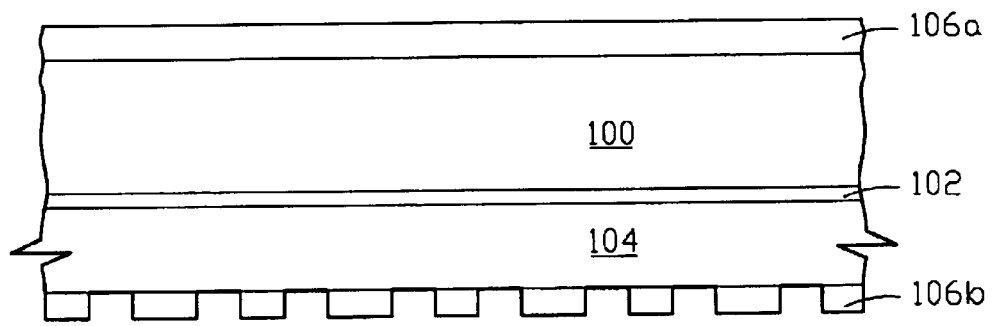
Figure 2C:
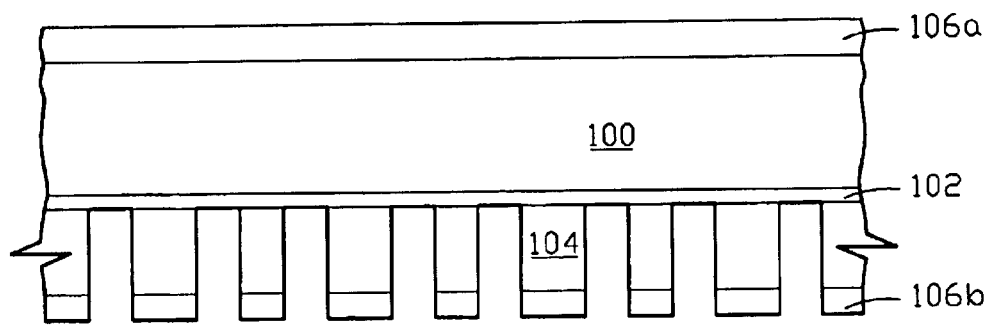
Figure 2D:
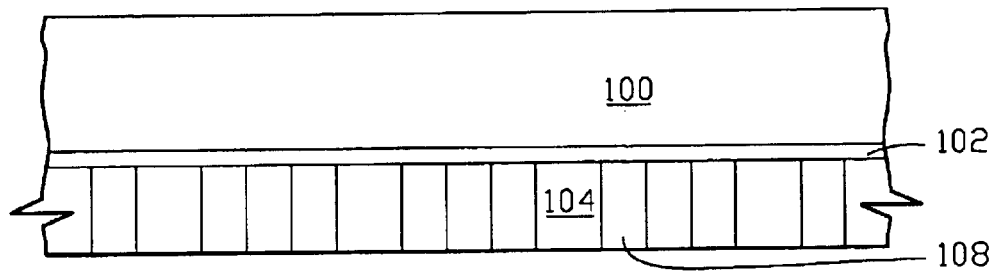
Figure 2E:
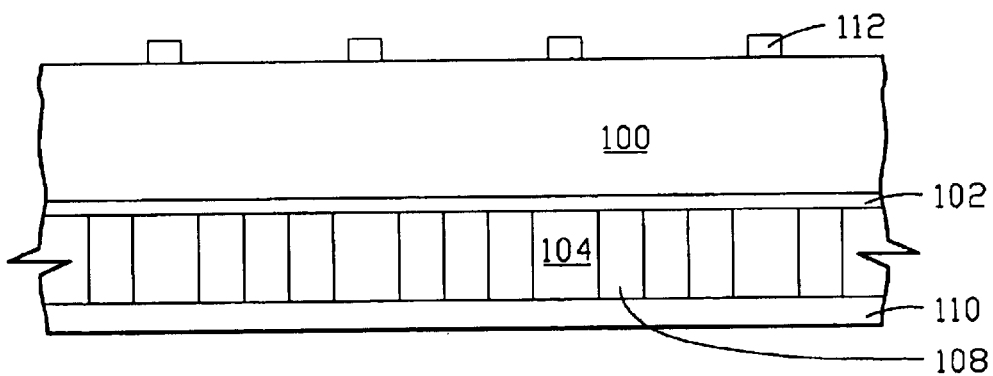
Figure 2F:
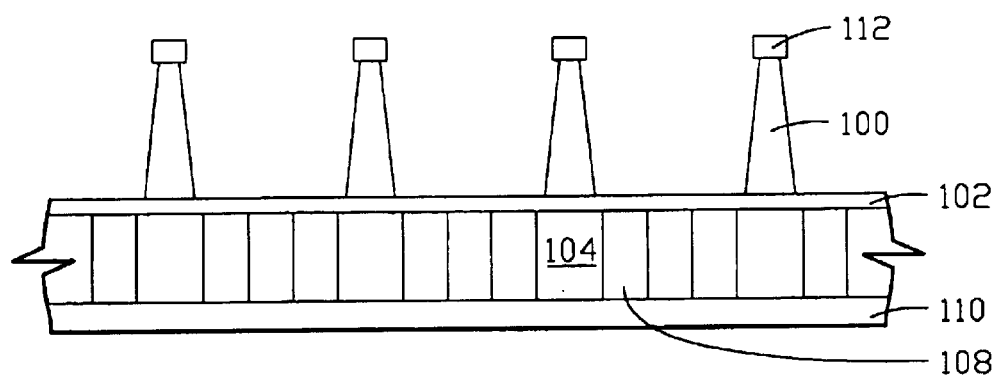
Figure 2G:
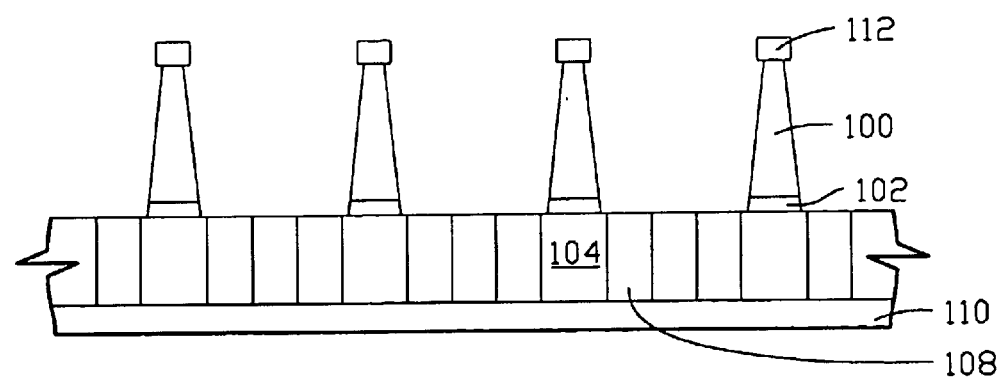
Figure 2H:
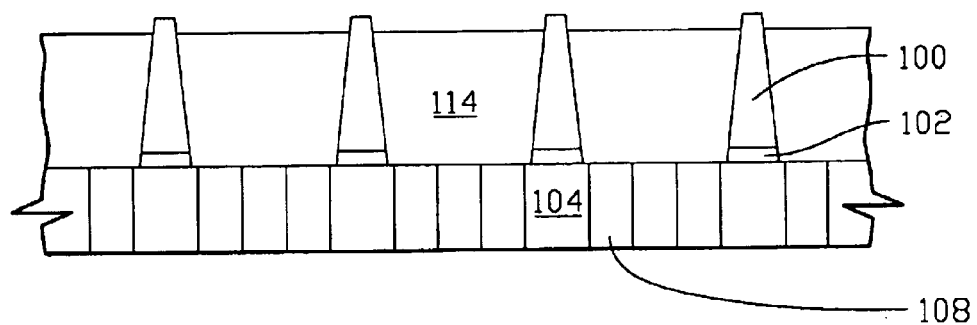

The flip chip multi-layer substrate of this invention is formed by simultaneous lamination process. The stacked layers comprise several laminating layers with via, pattern and dielectric, a bottom layer, and pad opening layers which are optional. In the first and second embodiments of this invention, the laminating layers with vias and conductive patterns are formed by etching a structure of a thick metal layer, a thin barrier metal layer and a thin metal layer. FIGS. 2A–2H show a process flow according to a first preferred embodiment. Referring to FIG. 2A, a structure of a thick metal layer 100, a thin barrier metal layer 102 and a thin metal layer 104 is shown. The thicknesses of the metal layers 100 and 104 could be, for example, about 30 microns to 400 microns and about 5 microns to 35 microns. The metal layers 100 and 104 comprise copper, and the barrier metal layer 102 could comprise chrome, lead, aluminum, silver, nickel, tin, lead or tin/lead alloy. The thick metal layer 100 is used to formed vias and the thin metal layer 104 is used to form patterns. Next referring to FIG. 2B, photoresist layers 106a and 106b are respectively formed on the metal layer 100 and 104, and the photoresist layer 106b is patterned to expose a portion of the metal layer 104 to form circuit patterns. Then referring to FIG. 2C, the metal layer 104 is etched to expose a portion of the barrier metal 102 and form conductive patterns thereon. Next referring to FIG. 2D, the photoresist layers 106a and 106b are removed, and a dielectric layer 108 is formed over the metal layer 104 and is thinned to expose the metal layer 104. The dielectric layer 108 comprises a semi-cured material. The dielectric layer 108 is thinned by grinding, plasma etching or chemical mechanical polishing. Then referring to FIG. 2E, a photoresist layer 112 is formed over the metal layer 100 and is patterned to form via patterns, and a dielectric layer 110 as an etching mask is formed on the metal layer 104 and the dielectric layer 108. Next referring to FIG. 2F, the metal layer 100 is etched to expose a portion of the barrier metal layer 102 and to form a plurality of vias thereon. The exposed barrier metal layer 102 is then etched to expose the metal layer 104 and the dielectric layer 108 as shown in FIG. 2G. The photoresist layer 112 and the dielectric layer 110 are then removed, and a dielectric layer 114 is formed between the vias as shown in FIG. 2H. The dielectric layer 114 comprises a dielectric resin such as a thermal plastic resin or a thermal setting resin.

Figure 3A:
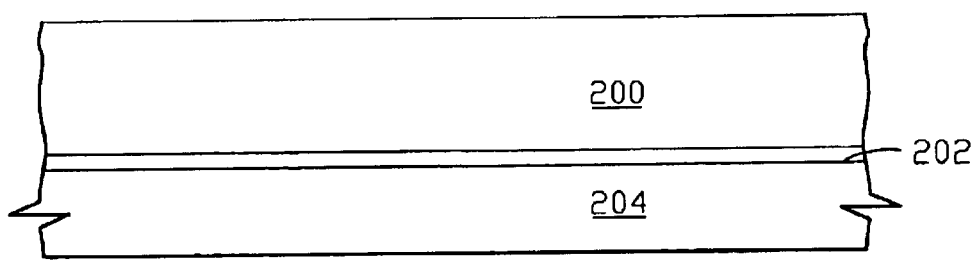
FIGS. 3A–3H show a process flow according to a second preferred embodiment of forming a laminating layer with vias, conductive patterns and dielectric layers.
Figure 3B:
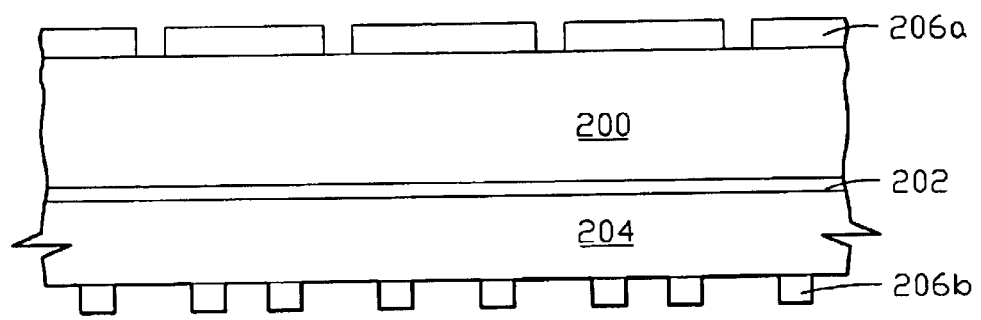
Figure 3C:
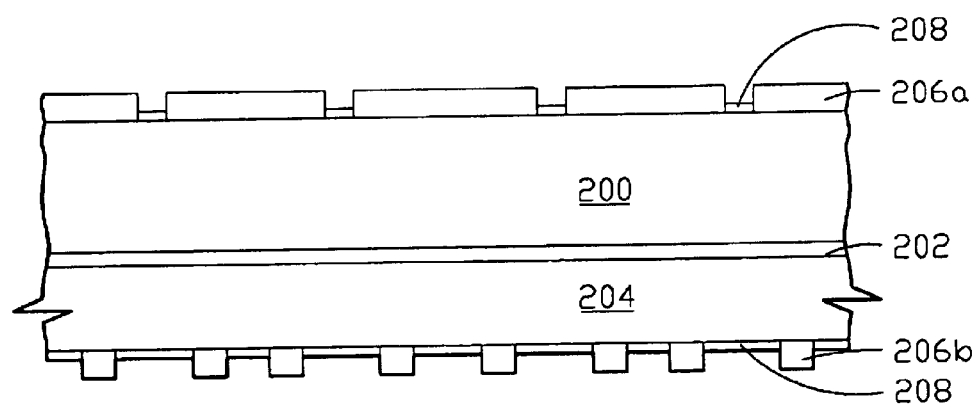
Figure 3D:
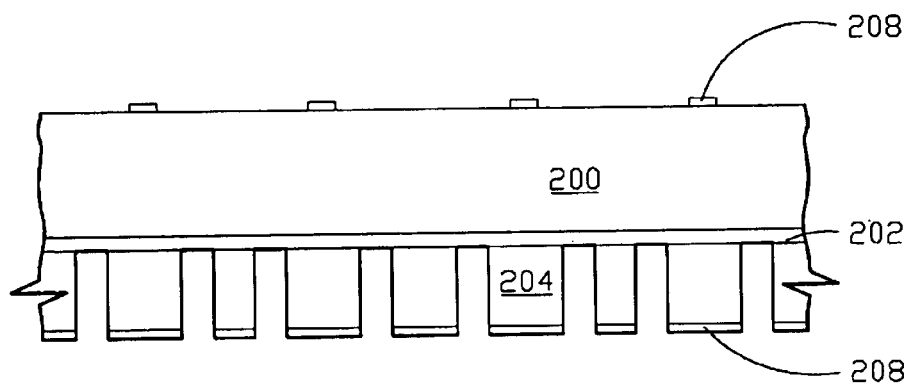
Figure 3E:
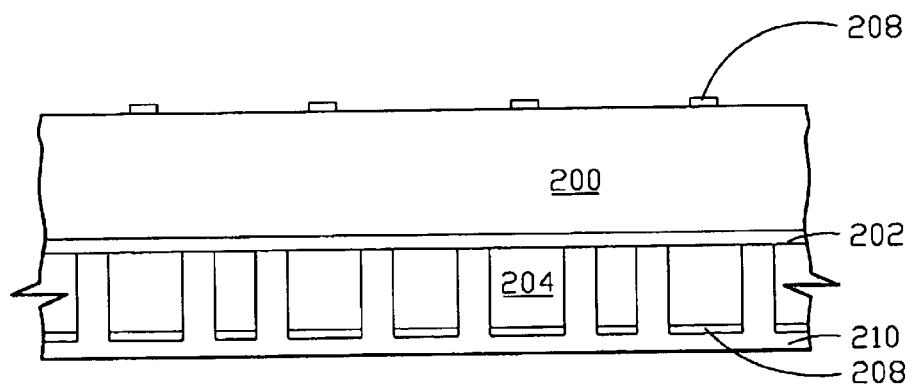
Figure 3F:
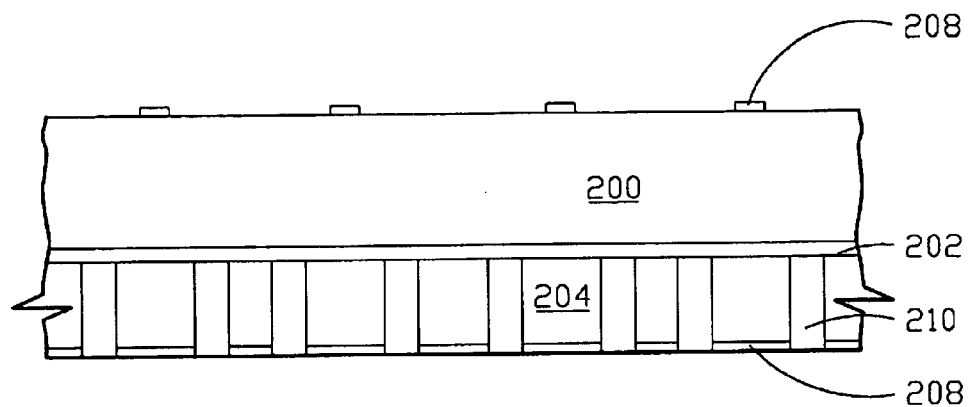
Figure 3G:
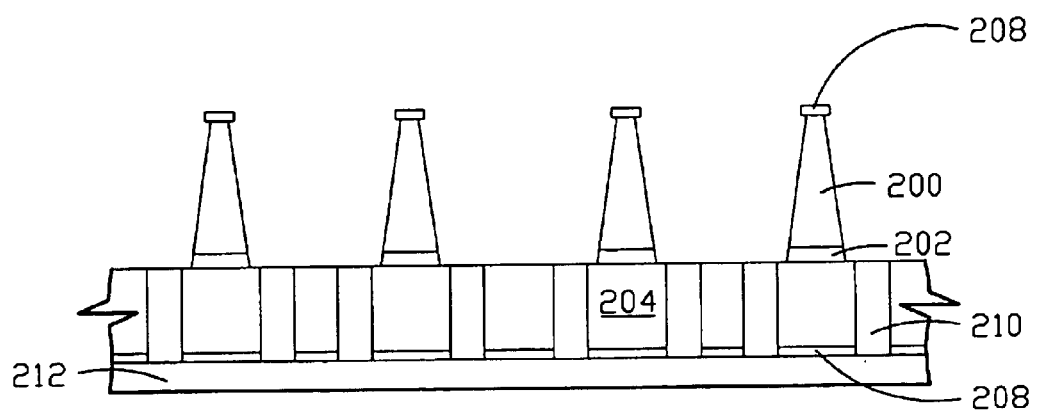
Figure 3H:
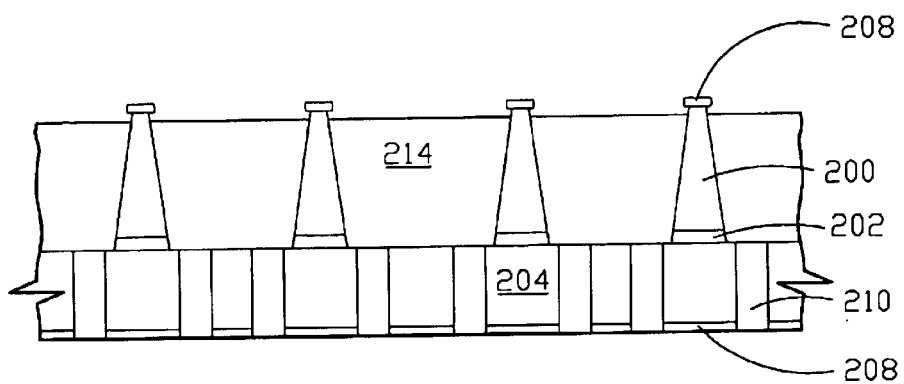

FIGS. 3A–3H show a process flow according to a second preferred embodiment. Referring to FIG. 3A, a structure of a thick metal layer 200, a thin barrier metal layer 202 and a thin metal layer 204 is shown. The thick metal layer 200 is used to formed vias and the thin metal layer 204 is used to form conductive patterns. The thicknesses of the metal layers 200 and 204 could be, for example, about 30 microns to 400 microns and about 5 microns to 35 microns. The metal layers 200 and 204 comprise copper, and the barrier metal layer 202 could comprise chrome, lead, aluminum, silver, nickel, tin, lead or tin/lead alloy. Next referring to FIG. 3B, patterned photoresist layers 206a and 206b are respectively formed on the metal layer 200 and 204 and expose a portion of the metal layers 200 and 204 to form circuit patterns. Then referring to FIG. 3C, a metal layer 208 is formed on the exposed metal layers 200 and 204. The metal layer 208 is preferably formed by a plating process. Next referring to FIG. 3D, the photoresist layers 206a and 206b are removed, and the metal layer 204 is etched to expose a portion of the barrier metal 202 and form conductive patterns thereon. Then referring to FIG. 3E, a dielectric layer 210 is formed over the barrier metal 202 and the metal layer 208. The dielectric layer 210 is preferably a semi-cured material. Next referring to FIG. 3F, the dielectric layer 210 is thinned to expose the metal layer 208 by grinding, plasma etching or chemical mechanical polishing. Then, the metal layer 200 is etched to expose the barrier metal layer 202 and to form vias thereon, and the exposed barrier metal layer 202 is sequentially removed as shown in FIG. 3G. A dielectric layer 212 as mask is formed on the dielectric layer 210 and the metal layer 208 as also shown in FIG. 3G. A dielectric layer 214 is formed between the vias 200, and then the dielectric layer 210 is removed as shown in FIG. 3H. The dielectric layer 214 comprises a dielectric resin such as a thermal plastic resin or a thermal setting resin.

Figure 4A:
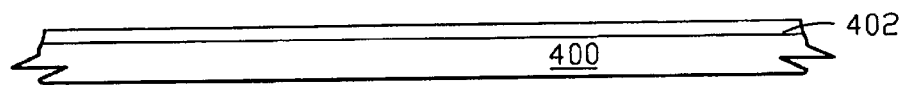
FIGS. 4A–4I show a process flow according to a third preferred embodiment of forming a laminating layer with vias, conductive patterns and dielectric layers.
Figure 4B:
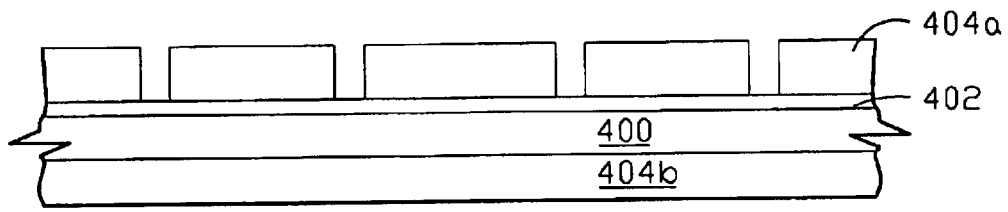
Figure 4C:
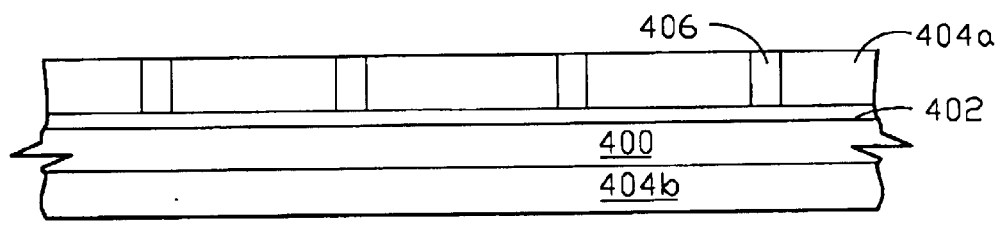
Figure 4D:
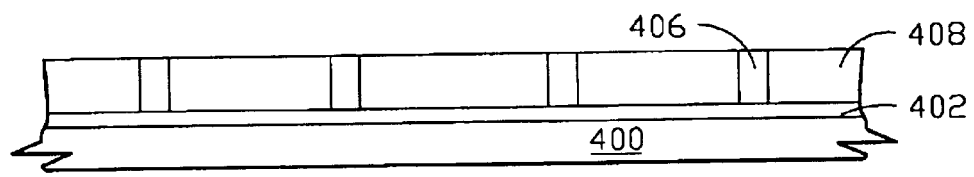
Figure 4E:
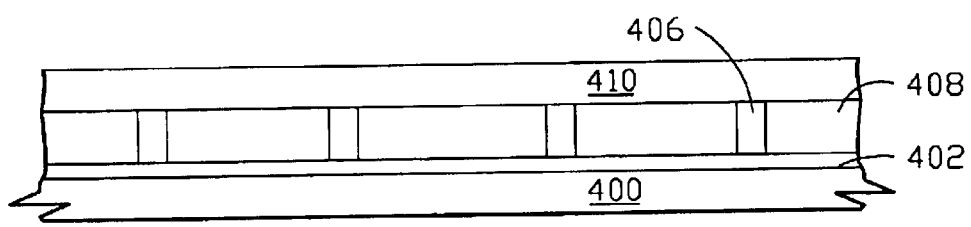
Figure 4F:
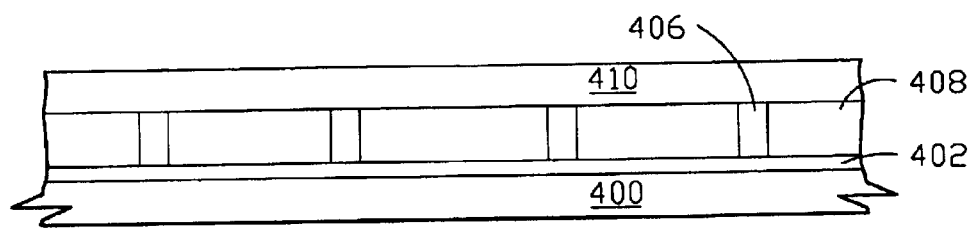
Figure 4G:
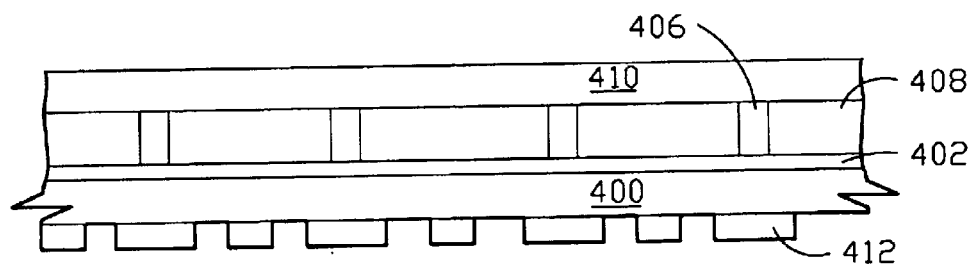
Figure 4H:
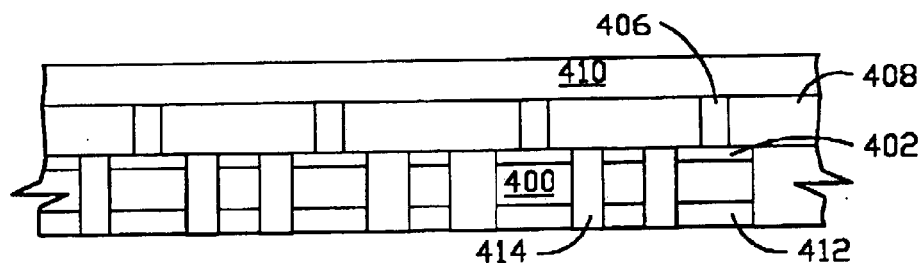
Figure 4I:
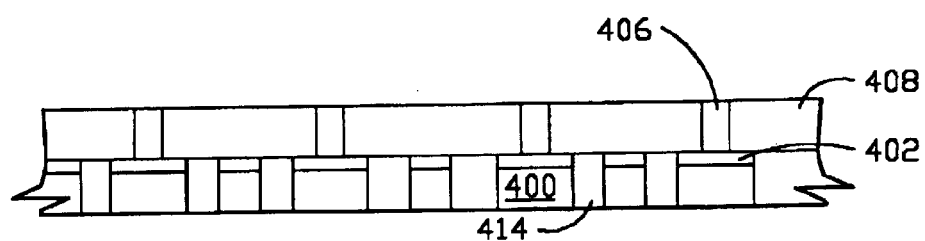

FIGS. 4A–4I show a process flow according to a third preferred embodiment. In the third embodiment of this invention, the vias of the laminating layers are formed by deposition, and the conductive patterns of the laminating layers are formed by etching a structure of a thin barrier metal layer and a thin metal layer. Referring to FIG. 4A, a structure of a thin metal layer 400 and a thin barrier metal layer 402 is shown. The thicknesses of the metal layer 400 could be, for example, about 5 microns to 35 microns. The metal layers 400 comprise copper, and the barrier metal layer 402 could comprise chrome, lead, aluminum, silver, nickel, tin, lead or tin/lead alloy. Next referring to FIG. 4B, photoresist layers 404a and 404b are respectively formed on the barrier metal layer 402 and metal layer 400, and the photoresist layer 404a is patterned to expose a portion of the barrier metal layer 402 to form via patterns. Then referring to FIG. 4C, a metal layer 406 is formed on the barrier metal layer 402 to form vias. The metal layer 406 is preferably formed by plating. Next referring to FIG. 4D, the photoresist layers 404a and 404b are removed by stripping, and a dielectric layer 408 is formed on the barrier metal layer 402 and between the vias 406. The dielectric layer 408 comprises a semi-cured material. Then referring to FIG. 4E, a protection film 410 is formed over the metal layer 406 and the dielectric layer 408. Next referring to FIG. 4F, the metal layer 400 is thinned. Then, a photoresist layer 412 is formed on the metal layer 400 and is patterned to expose the metal layer 400 for forming circuit patterns as shown in FIG. 4G. The exposed metal layers 400 and 402 are etched to form circuits and a dielectric resin 414 such as a thermal plastic resin or a thermal setting resin is formed as shown in FIG. 4H. Finally, the photoresist layer 412 and the protection film 410 are removed, and the dielectric resin 414 is planarized as shown in FIG. 4I.

Figure 5A:
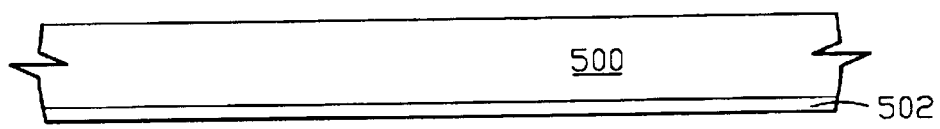
FIGS. 5A–5G show a process flow according to a fourth preferred embodiment of forming a laminating layer with vias, conductive patterns and dielectric layers.
Figure 5B:
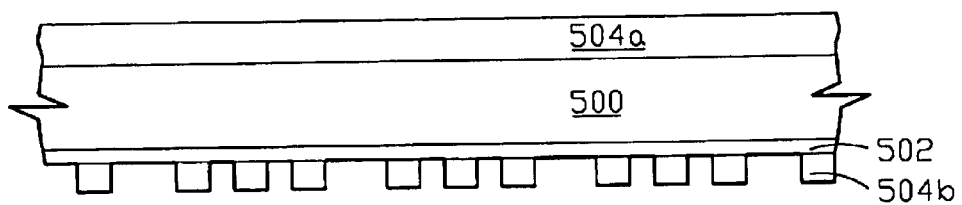
Figure 5C:
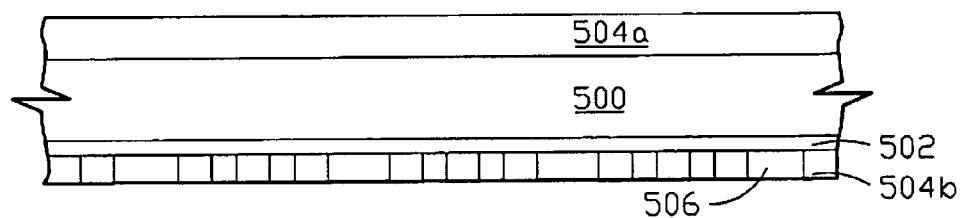
Figure 5D:
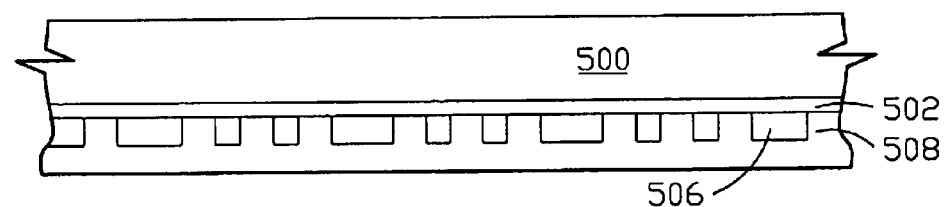
Figure 5E:
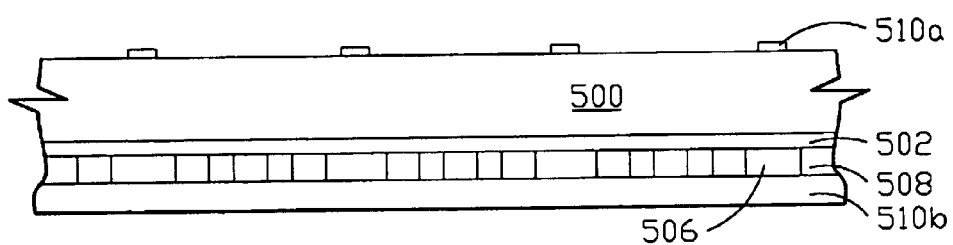
Figure 5F:
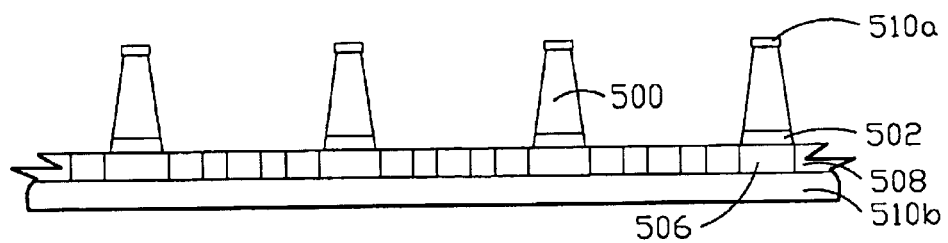
Figure 5G:
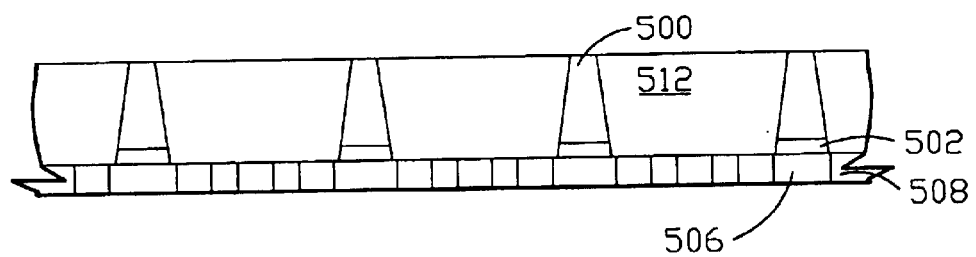

FIGS. 5A–5G show a process flow according to a fourth preferred embodiment. In the fourth embodiment of this invention, the vias of the laminating layers are formed by etching a structure of a thick metal layer and a thin barrier metal layer, and the conductive patterns of the laminating layers are formed by deposition. Referring to FIG. 5A, a structure of a thick metal layer 500 and a thin barrier metal layer 502 is shown. The thicknesses of the metal layers 500 could be, for example, about 30 microns to 750 microns. The metal layer 500 comprises copper and the barrier metal layer 502 could comprise chrome, lead, aluminum, silver, nickel, tin, lead or tin/lead alloy. Next referring to FIG. 5B, photoresist layers 504a and 504b are respectively formed on the metal layer 500 and the barrier metal layer 502, and the photoresist layer 504b is patterned to expose a portion of the barrier metal layer 502 to form circuit patterns. Then referring to FIG. 5C, a metal layer 506 is formed on the barrier metal layer 502 to form conductive patterns. The metal layer 506 is preferably formed by plating. Next referring to FIG. 5D, the photoresist layers 504a and 504b are removed by stripping, and a dielectric layer 508 is formed over the conductive patterns 506 and the barrier metal layer 502. Then referring to FIG. 5E, the dielectric layer 508 is thinned to expose the metal layer 506, and photoresist layers 510a and 510b are formed, and the photoresist layer 510b is patterned to expose the metal layer 500. Next referring to FIG. 5F, the exposed metal layers 500 and the barrier metal layer 502 are etched to form vias and expose the dielectric layer 508 and the metal layer 506. Finally, the photoresist layers 510a and 510b are removed by stripping, and a dielectric layer 512 which comprises a dielectric resin such as a thermal plastic resin or a thermal setting resin is formed between the vias 500 as shown in FIG. 5G.

Figure 6A:
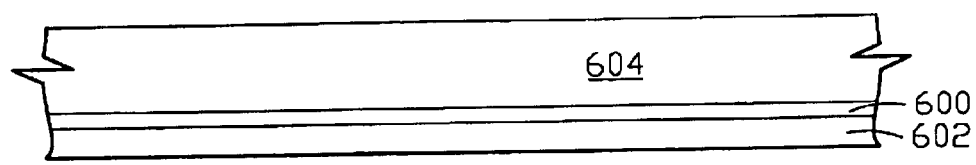
FIGS. 6A–6E show a process flow according to a fifth preferred embodiment of forming a laminating layer with vias, conductive patterns and dielectric layers.
Figure 6B:
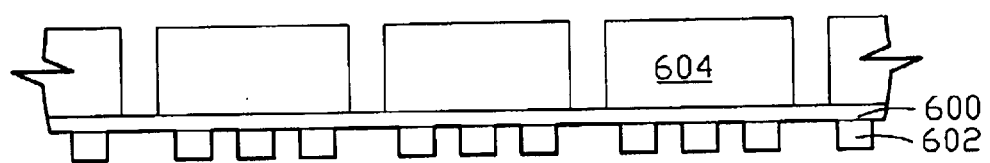
Figure 6C:
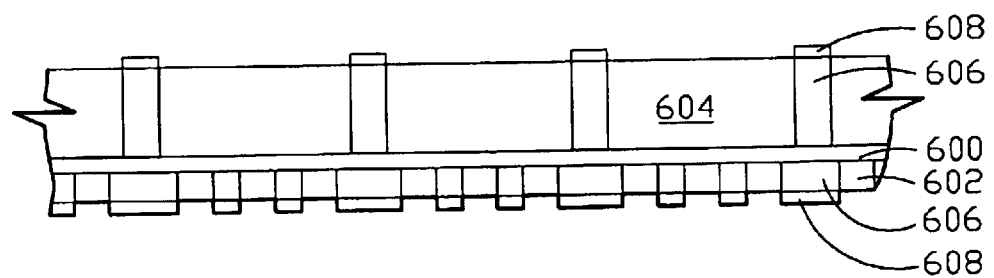
Figure 6D:
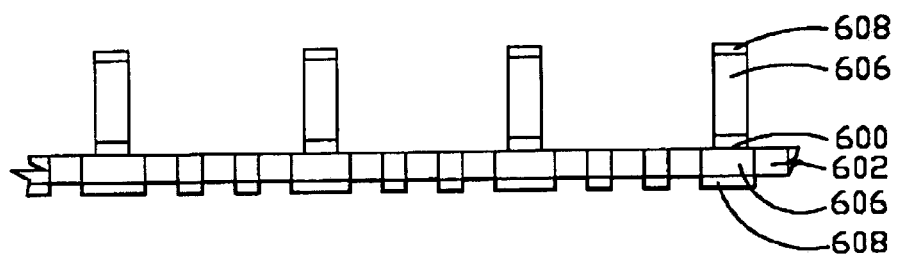
Figure 6E:
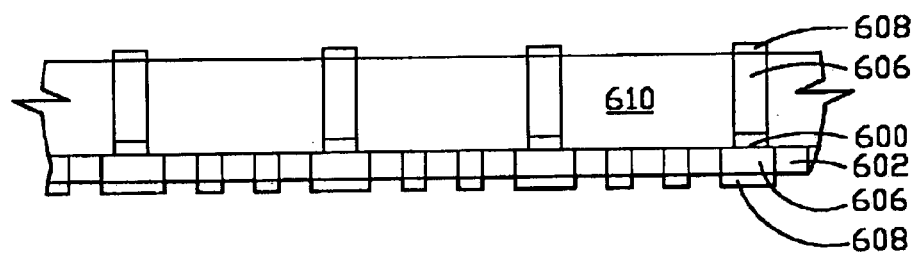

FIGS. 6A–6E show a process flow according to a fifth preferred embodiment. In the fifth embodiment of this invention, the vias and patterns of the laminating layers are formed on a thin barrier metal layer by deposition. Referring to FIG. 6A, a thin barrier metal layer 600 having a photo dielectric layer 602 and a photoresist layer 604 respectively on two sides is shown. The barrier metal layer 600 could comprise chrome, lead, aluminum, silver, nickel, tin, lead, and tin/lead alloy. Next referring to FIG. 6B, the photoresist layer 604 and the photo dielectric layer 602 are patterned to expose the barrier metal layers 600 and to form circuit and via patterns. Then referring to FIG. 6C, a metal layer 606 is formed on the barrier metal layer 600, and a surface thin metal layer 608 is formed on the metal layer 606. The metal layer 606 is preferably formed by plating and the surface thin metal layer 608 is preferably formed by plating or electroless plating. The thin metal layer 608 is used to improve the bonding between metal layers. Next referring to FIG. 6D, the photoresist layer 604 is removed and the exposed thin barrier metal layer 600 is etched to expose the photo dielectric layer 602 and the metal layer 606. Referring to FIG. 6E, a dielectric layer 610 which comprises a dielectric resin such as a thermal plastic resin or a thermal setting resin is formed on the photo dielectric layer 602 and the metal layer 606 finally.

Figure 7A:
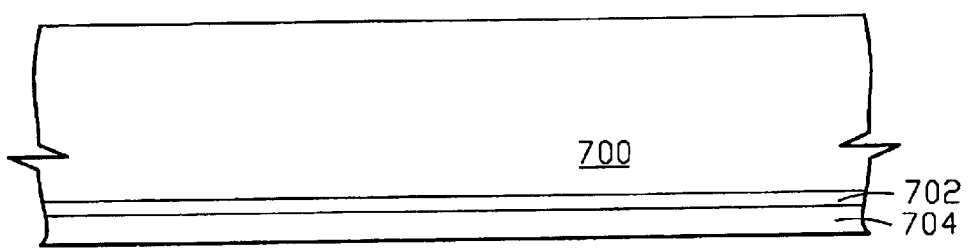
FIGS. 7A–7D show a process flow of forming a bottom layer.
Figure 7B:
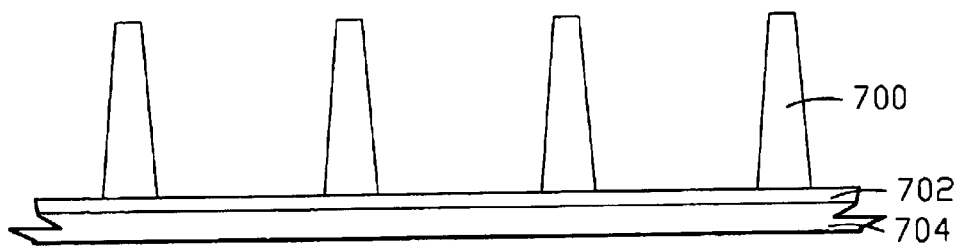
Figure 7C:
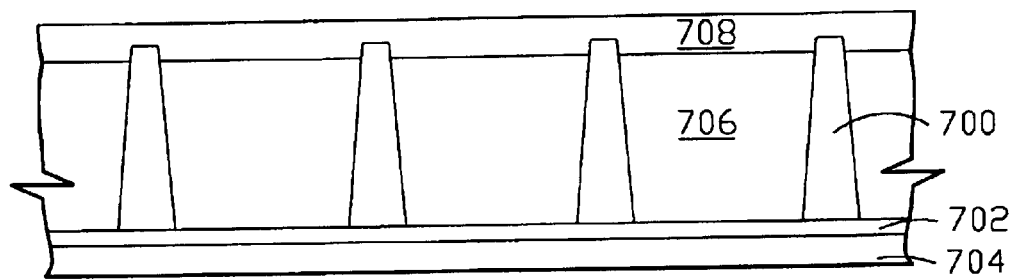
Figure 7D:
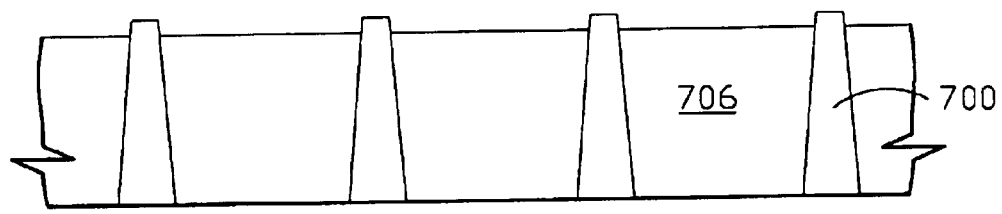

FIGS. 7A–7D show a process flow of forming a bottom layer. Referring to FIG. 7A, a structure of a thick metal layer 700, a thin barrier metal layer 702 and a thin metal layer 704 is shown. Next referring to FIG. 7B, the metal layer 700 is etched to expose a portion of the barrier metal layer 702 to form vias. Then referring to FIG. 7C, a dielectric layer 706 is formed on the thin barrier metal layer 702 and between the vias, and a protection film 708 is formed on the vias and the dielectric layer 706. Next referring to FIG. 7D, the thin metal layer 704 and the thin barrier metal layer 702 are sequentially etched, and the protection film 708 is then removed to form the bottom layer.

Figure 8A:
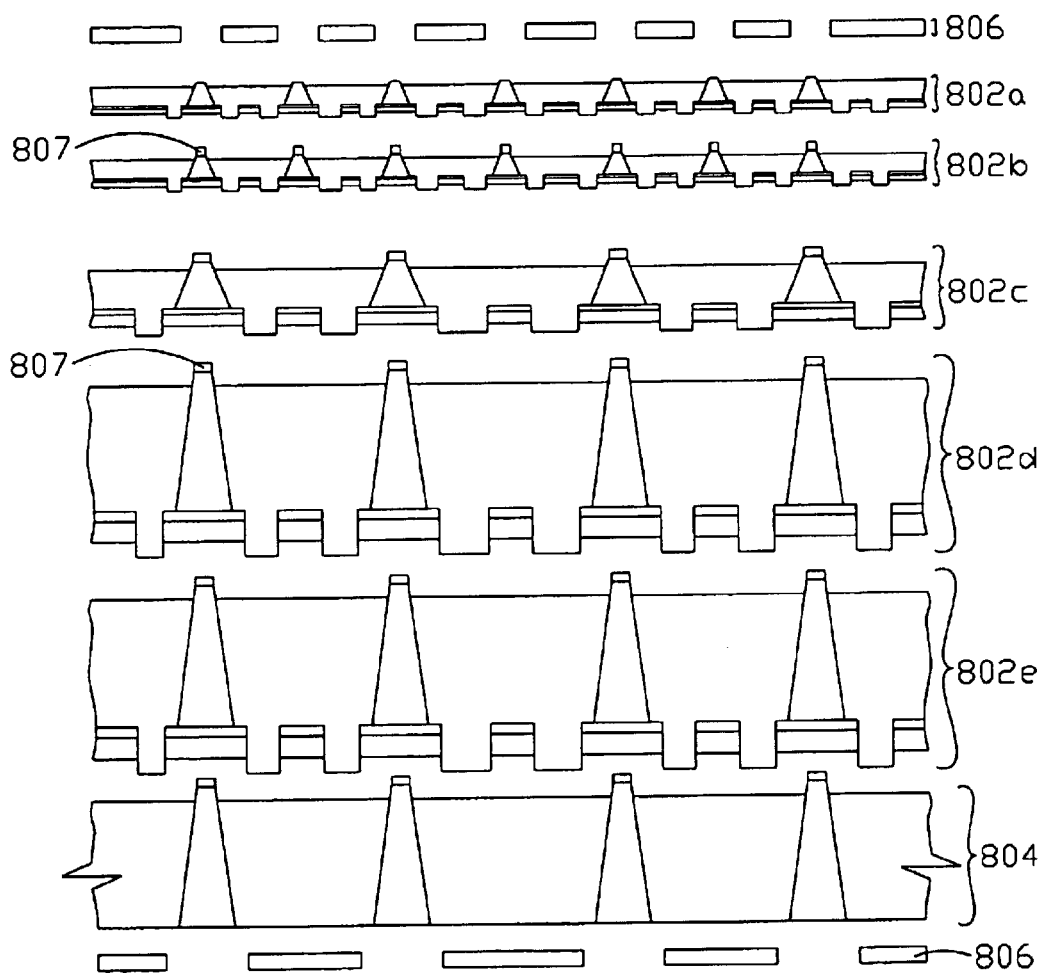
FIGS. 8A–8B show a simultaneous lamination process flow according to the invention.
Figure 8B:
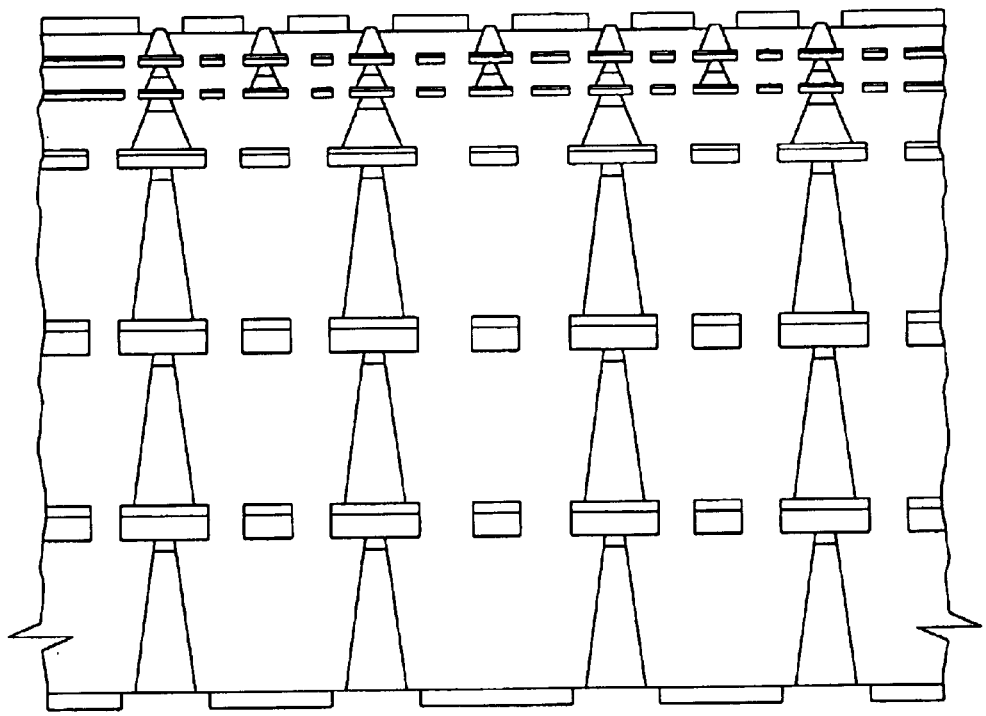
Figure 8C:
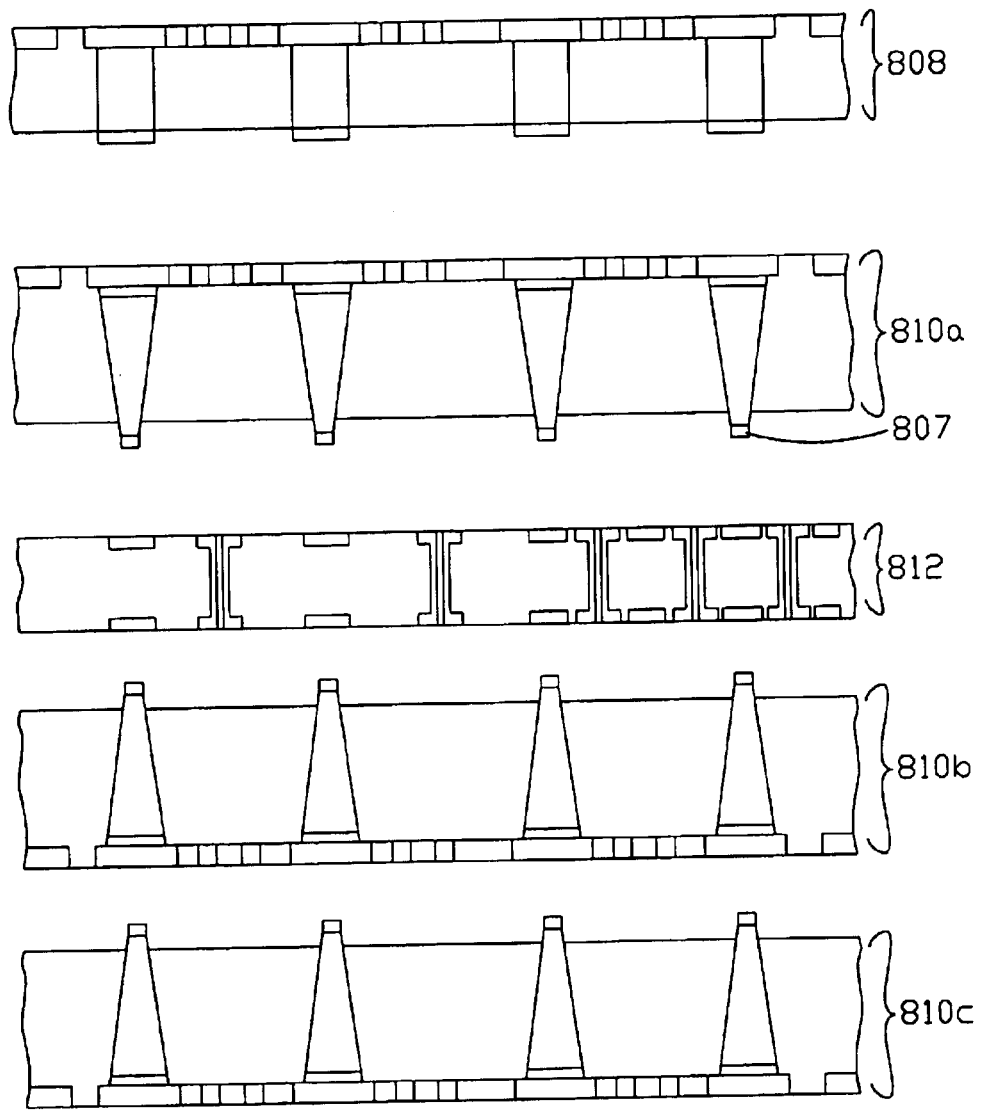
FIGS. 8C–8D show another simultaneous lamination process flow according to the invention.
Figure 8D:
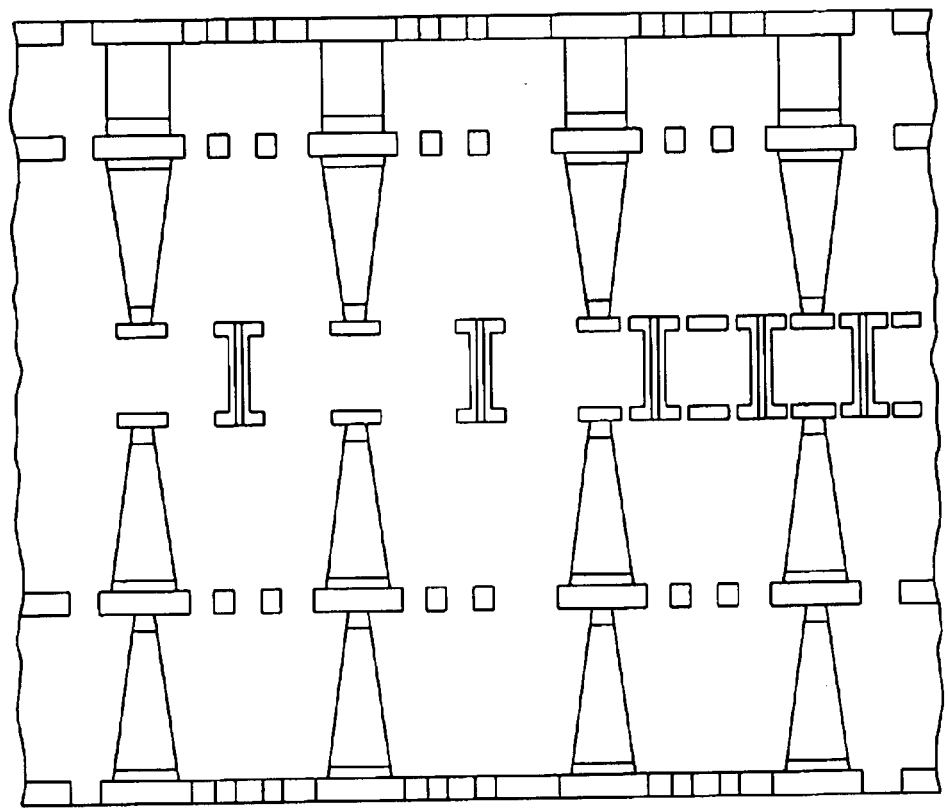

FIG. 8A–8B show a simultaneous lamination process flow according to the invention. Referring to FIG. 8A, laminating layers 802a, 802b, 802c, 802d, and 802e respectively having a plurality of vias, conductive patterns and a dielectric layer, a bottom layer 804 and two pad opening layers 806 are aligned and stacked. The pad opening layer 806 could be a dielectric layer or a solder mask. The pad opening layers 806 are optional. FIG. 8B shows the result of simultaneously laminating the laminating layers 802, the bottom layer 804 and the pad opening layers 806 to form a multi-layered substrate. FIG. 8C–8D show another simultaneous lamination process flow according to the invention. Referring to FIG. 8C, laminating layers 808 and 810a, 810b, 810c respectively having a plurality of vias, conductive patterns and a dielectric layer formed by the embodiments mentioned above and a core substrate 812 are aligned and stacked. The core substrate 812 has conductive patterns and several conductive through holes. The layers 808 and 810 can be laminated on one side or both sides of the core substrate 812. FIG. 8D shows the result of simultaneously laminating the laminating layers 808, 810 and the core substrate 812 to form a multi-layered substrate. The layers 808 and 810 can also be laminated with more than one core substrate. In order to improve the bonding between the vias and conductive patterns of two layers, a metal layer 807 can be formed on the vias. The metal layer 807 could comprise solder, nickel gold alloy and a combination of solder and nickel gold alloy.

The invention provides a multi-layered substrate/printed circuit board with high circuit layout density manufactured by a simultaneously laminating process. The stacked layers comprise laminating layers with solid metal vias, conductive patterns and dielectric material, bottom layers with solid metal vias and pad opening layers which is optional. The conductive patterns and vias of the stacked layers can be formed by metal etching, pattern deposition, semi-additive processes and full-additive processes. These stacked layers with a high circuit density and fine patterns formed individually before the lamination step can make the whole process easier. Moreover, the substrate has a structure of solid vias so that the substrate can has good electrical and thermal performance. The substrate can also has a smaller bump/ball pitch layout due to the landless design of top/bottom pad layers. The substrate has a high production yield because no sequential buildup process which will increase variation of the substrate is used. Furthermore, the production cost of the substrate is low due to the use of conventional processes and equipments. Finally, since all layers are separately formed and simultaneously laminated, the throughput of the substrate is high and the production cycle time is short.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A lamination multilayer substrate, at least comprising:
    a plurality of laminating layers stacked and laminated together, wherein each said laminating layer has a dielectric layer with a first side and a second side, a patterned conductive layer positioned at the first side, and a plurality of conductive vias with a first ends and second ends positioned within the dielectric layer, wherein the first ends of the conductive vias electrically connect with the patterned conductive layer and the second ends of the first vias electrically connect with an adjacent said laminating layer and a barrier metal layer between said first vias and said patterned conductive layer, wherein said barrier metal layer is a stop layer between said first vias and said patterned conductive layer; and
    a bottom layer stacked and laminated with the plurality of laminating layers and disposed at a bottom side of the multilayer substrate, wherein said bottom layer has a second dielectric layer and a plurality of conductive vias penetrating the second dielectric layer and electrically connecting with the plurality of laminating layers, wherein said first dielectric layers and said second dielectric layer are bonded together.

2. The multilayer substrate according to claim 1, further comprising two pad opening layers disposed respectively at top and bottom sides of the multilayer substrate.

3. The multilayer substrate according to claim 2, wherein said pad opening layer is a solder mask.

4. The multilayer substrate according to claim 1, further comprising a metal layer disposed on said second ends of the conductive vias.

5. The multilayer substrate according to claim 4, wherein said metal layer is selected from one of solder, nickel gold alloy and a combination of solder and nickel gold alloy.

6. The multilayer substrate according to claim 1, further comprising a heat sink disposed a top side of said multilayer substrate.

7. The multilayer substrate according to claim 1, wherein said first and said second dielectric layers are selected from one of a thermoplastic resin and a thermosetting resin.

8. A lamination multilayer substrate, at least comprising:
a core substrate having a plurality of through holes therein; and
a plurality of laminating layers stacked and laminated on said core substrate, wherein each said laminating layer has a dielectric layer with a first side and a second side, a patterned conductive layer positioned at the first side, and a plurality of conductive vias with a first ends and second ends positioned within the dielectric layer and a barrier metal layer between the patterned conductive layer and the first end of the conductive vias, wherein the barrier metal layer is a stop layer between the patterned conductive layer and the conductive vias, and the first ends of the vias electrically connect with the patterned conductive layer and the second ends of the conductive vias electrically connect with an adjacent layer of one of said laminating layers and said core substrate, wherein said dielectric layers are bonded together.

9. The multilayer substrate according to claim 8, further comprising two pad opening layers disposed respectively at top and bottom sides of the multilayer substrate.

10. The multilayer substrate according to claim 9, wherein said pad opening layer is a solder mask.

11. The multilayer substrate according to claim 8, further comprising a metal layer disposed on said second ends of the vias and between one of said adjacent laminating layer.

12. The multilayer substrate according to claim 11, wherein said metal layer is selected from one of solder, nickel gold alloy and a combination of solder and nickel gold alloy.

13. The multilayer substrate according to claim 8, further comprising a heat sink disposed on a top side of said multilayer substrate.

14. The multilayer substrate according to claim 8, wherein said dielectric layers are selected from one of a thermoplastic resin and a thermosetting resin.

15. The multilayer substrate according to claim 8, wherein said laminating layers are laminated on both two sides of said core substrate.

16. The multilayer substrate according to claim 8, wherein said laminating layers are laminated on one side of said core substrate.

17. The multilayer substrate according to claim 8, further comprising a heat sink disposed on a top side of said multilayer substrate.

* * * * *